United States Patent
Inoi et al.

[11] Patent Number: 6,057,633
[45] Date of Patent: *May 2, 2000

[54] PIEZOELECTRIC TRANSFORMER UNIT

[75] Inventors: Takayuki Inoi; Naoto Taihaku; Hiromi Suzuki, all of Tokyo, Japan

[73] Assignee: NEC Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 09/098,437

[22] Filed: Jun. 17, 1998

[30] Foreign Application Priority Data

Jun. 19, 1997 [JP] Japan ................................ 9-162203

[51] Int. Cl.[7] .................................................. H01L 41/08
[52] U.S. Cl. ..................................... 310/345; 310/348
[58] Field of Search ................................ 310/344, 346, 310/348, 354–356, 358, 359

[56] References Cited

U.S. PATENT DOCUMENTS

| | | | |
|---|---|---|---|
| 4,034,318 | 7/1977 | Ishiyama et al. | 310/345 X |
| 4,511,821 | 4/1985 | Nakamura et al. | 310/344 |
| 5,250,870 | 10/1993 | Fenlon et al. | 310/345 |
| 5,365,141 | 11/1994 | Kawai et al. | 310/359 |
| 5,440,195 | 8/1995 | Ohnishi et al. | 310/359 |
| 5,747,916 | 5/1998 | Sugimoto et al. | 310/348 |
| 5,841,217 | 11/1998 | Kizaki et al. | 310/345 X |
| 5,859,488 | 1/1999 | Okeshi et al. | 310/348 X |
| 5,880,553 | 3/1999 | Okeshi et al. | 310/344 X |

FOREIGN PATENT DOCUMENTS

| | | |
|---|---|---|
| 0148361 | 7/1985 | European Pat. Off. . |
| 0730312 | 9/1996 | European Pat. Off. . |
| 06342945 | 12/1994 | Japan ............................. 310/345 |
| 8-298213 | 11/1996 | Japan . |

OTHER PUBLICATIONS

M. Sugimoto et al., "Very Compact Inverter for Color LCD Backlight Utilizing a Packaged Piezoelectric Ceramic Transformer", *SID 96 Digest*, 1996, pp. 757–760 No Month.

Kawashima et al., "Development of Color–LCD Backlight Inverters Utilizing Piezoelectric Transformer", *NEC Res. & Develop.*, vol. 36, No. 1, Jan. 1995, pp. 187–192.

*Primary Examiner*—Mark O. Budd
*Attorney, Agent, or Firm*—Sughrue, Mion, Zinn, Macpeak & Seas, PLLC

[57] ABSTRACT

In order to achieve the above and other objects, a piezoelectric transformer unit is provided. The unit contains a piezoelectric transformer element, a first upper electrode, a first lower electrode, an insulator casing, a first lead terminal, and an insulator elastic member. The piezoelectric transformer element has a upper element surface, a lower element surface, and a first side element surface. The first upper electrode is formed on the upper element surface of the piezoelectric transformer element, and the first lower electrode is formed on the lower element surface of the piezoelectric transformer element. The insulator casing houses the piezoelectric transformer element. The first lead terminal protrudes from an inner surface of the insulator casing, supports the piezoelectric transformer element within the insulator casing, and vertically presses the an oscillation nodal point of the piezoelectric transformer element. The insulator elastic member is arranged between an oscillation nodal point on one of the upper, lower, and first side element surfaces of the piezoelectric transformer element and the insulator casing.

42 Claims, 9 Drawing Sheets

PIEZOELECTRIC TRANSFORMER UNIT

FIELD OF THE INVENTION

The present invention generally relates to a piezoelectric transformer unit which is used in many types of devices. For example, piezoelectric transformer units are used in inverter circuits for cold-cathode tube backlighting liquid crystal display panels in notebook personal computers and car navigation systems, in adapter power supply circuits generally used in consumer electronics, and in high-voltage generator circuits such as electronic copying machines. More particularly, the present invention relates to the manner in which a piezoelectric transformer element is held within a piezoelectric transformer casing.

BACKGROUND OF THE INVENTION

Figure 12A:
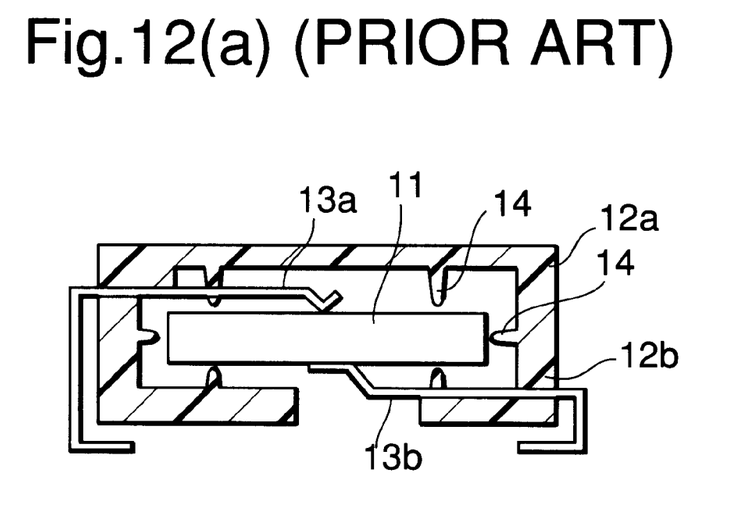
FIG. 12(a) shows a vertical cross sectional view of a conventional piezoelectric transformer unit.
Figure 12B:
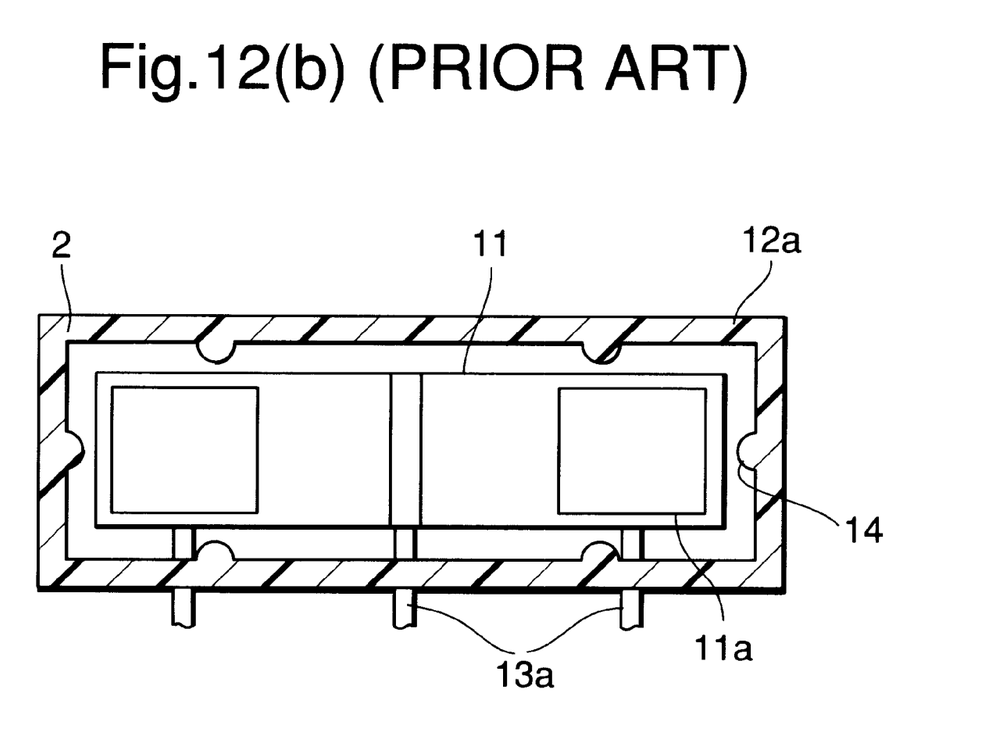
FIG. 12(b) shows a horizontal cross sectional view of the conventional piezoelectric transformer unit.

FIG. 12(a) shows a vertical cross sectional view of a conventional piezoelectric transformer unit, and FIG. 12(b) shows a horizontal cross sectional view of the unit. As shown in the figure, the transformer unit comprises a piezoelectric transformer element 11, an upper case 12a, a lower case 12b, upper lead terminals 13a, lower lead terminals 13b, and projections 14.

The upper and lower cases 12a and 12b are made of molded resin, and the lead terminals 13a and 13b are insert-molded into the cases 12a and 12b. Specifically, three upper lead terminals 13a are insert-molded in the upper case 12a, and three lower lead terminals 13b are insert molded in the lower case 12b.

As shown in FIG. 12(b), the piezoelectric transformer element 11 has three electrodes 11a formed on its lower surface. Also, although not shown in the figure, the element 11 has three similarly disposed electrodes 11a formed on its upper surface. The lower lead terminals 13b respectively contact oscillation nodal points on the electrodes 11a on the lower surface of the element 11, and the upper lead terminals 13a respectively contact oscillation nodal points on the electrodes 11a on the upper surface of the element 11. Thus, the lead terminals 13a and 13b support the piezoelectric transformer element 11 within the casing 12a and 12b as shown in FIG. 12(a).

Also, the projections 14 are formed at various locations on the inner surfaces of the casing 12a and 12b and protrude towards the interior of the casing 12a and 12b. The purpose of the projections 14 is to prevent the piezoelectric transformer element 11 from excessively shifting from a predetermined position with respect to the lead terminals 13a and 13b.

In the conventional device described above, the piezoelectric transformer element 11 is only supported by the elasticity of the lead terminals 13a and 13b at the upper and lower surfaces of the element 11. As a result, any jolt or impact to the device may easily cause the piezoelectric transformer element 11 to shift horizontally with respect to the lead terminals 13a and 13b and abut against the projections 14 and/or inner wall of the casing 12a and 12b. When the element 11 touches the projection 14 or casing 12a and 12b, the oscillation characteristics of the element 11 are deteriorated. In addition, when the element 11 abuts against the projections 14 or casing 12a and 12b, an oscillation having a frequency in the audible range is added to the piezoelectric transformer element 11, and such oscillation is propagated to the casing 12a and 12b and causes noise.

SUMMARY OF THE INVENTION

An object of the present invention is to provide a piezoelectric transformer unit that does not shift in position if an impact is applied to the unit and has a high quality output.

In order to achieve the above and other objects, a piezoelectric transformer unit is provided. The unit comprises: a piezoelectric transformer element having a upper element surface, a lower element surface, and a first side element surface; a first upper electrode formed on said upper element surface of said piezoelectric transformer element; a first lower electrode formed on said lower element surface of said piezoelectric transformer element; an insulator casing which houses said piezoelectric transformer element; a first lead terminal which protrudes from an inner surface of said insulator casing, supports said piezoelectric transformer element within said insulator casing, and vertically presses said an oscillation nodal point of said piezoelectric transformer element; and an insulator elastic member arranged between an oscillation nodal point on one of said upper, lower, and first side element surfaces of said piezoelectric transformer element and said insulator casing. Also, said insulator elastic member is arranged on or near a nodal line of the piezoelectric transformer element. The nodal line is perpendicular to the one of the upper, lower and first side element surface of the piezoelectric transformer element.

In the conventional example discussed above, the piezoelectric transformer element is supported via the lead terminals at the oscillation nodal points of the transformer element. However, experiments conducted by the inventors indicated that, if the oscillating body is additionally supported at a nodal point by an elastic body, the energy conversion efficiency of the body is not significantly reduced. In other words, by appropriately selecting the contact area between the elastic body and the piezoelectric transformer element, the hardness of the elastic body, and the position of the nodal point, the energy conversion efficiency is not substantially reduced.

In the present invention, the piezoelectric transformer element is supported at its nodal points by lead terminals and by an elastic body. Preferably, the position of the transformer element which contacts the elastic body is a position at which a nodal line of the transformer element exists. In the present invention, the elastic body has hardness of 30 to 80 (according to JIS K 6253). If the hardness is less than the above range, holding the transformer element at a predetermined position is difficult. Also, if the hardness is greater than the above range, the energy conversion efficiency is substantially reduced. For the same reasons, the contact area between the elastic body and the transformer element is set to equal 0.5 to 1.5 mm$^2$ per position when the area of the piezoelectric transformer element is 200 to 300 mm$^2$, the thickness of the element is 0.5 to 1.5 mm, and the number of positions where the elastic body contacts the element is 10 to 12).

Holding the piezoelectric transformer element by the elastic body at the nodal points on the sides of the piezoelectric transformer element prevents the element from being horizontally shifted by the oscillation of the element itself or by an external force. Holding the piezoelectric transformer element by the elastic body at the nodal points on the upper and lower surfaces of the piezoelectric transformer element prevents the element from being tilted by the oscillation of the element itself or by an external force. Therefore, the novel constitution described above prevents the contact point between the piezoelectric transformer element and the lead terminal from being shifted from the nodal point. Thus, the lead terminal does not hinder the oscillation of the piezoelectric transformer element, and the energy conversion efficiency of the element is maintained. Also, the novel constitution prevents the piezoelectric transformer element from contacting the casing and generating noise.

BRIEF DESCRIPTION OF THE DRAWINGS

The above objects and advantages of the present invention will become more apparent by describing in detail preferred embodiments thereof with reference to the attached drawings in which.

DETAILED DESCRIPTION OF THE PREFERRED EMBODIMENTS

The following description of the preferred embodiments discloses specific configurations, components, and values. However, the preferred embodiments are merely examples of the present invention, and thus, the specific features described below are merely used to more easily describe such embodiments and to provide an overall understanding of the present invention. Accordingly, one skilled in the art will readily recognize that the present invention is not limited to the specific embodiments described below. Furthermore, the descriptions of various configurations, components, and values of the present invention which would have been known to one skilled in the art are omitted for the sake of clarity and brevity.

First embodiment

Figure 1:
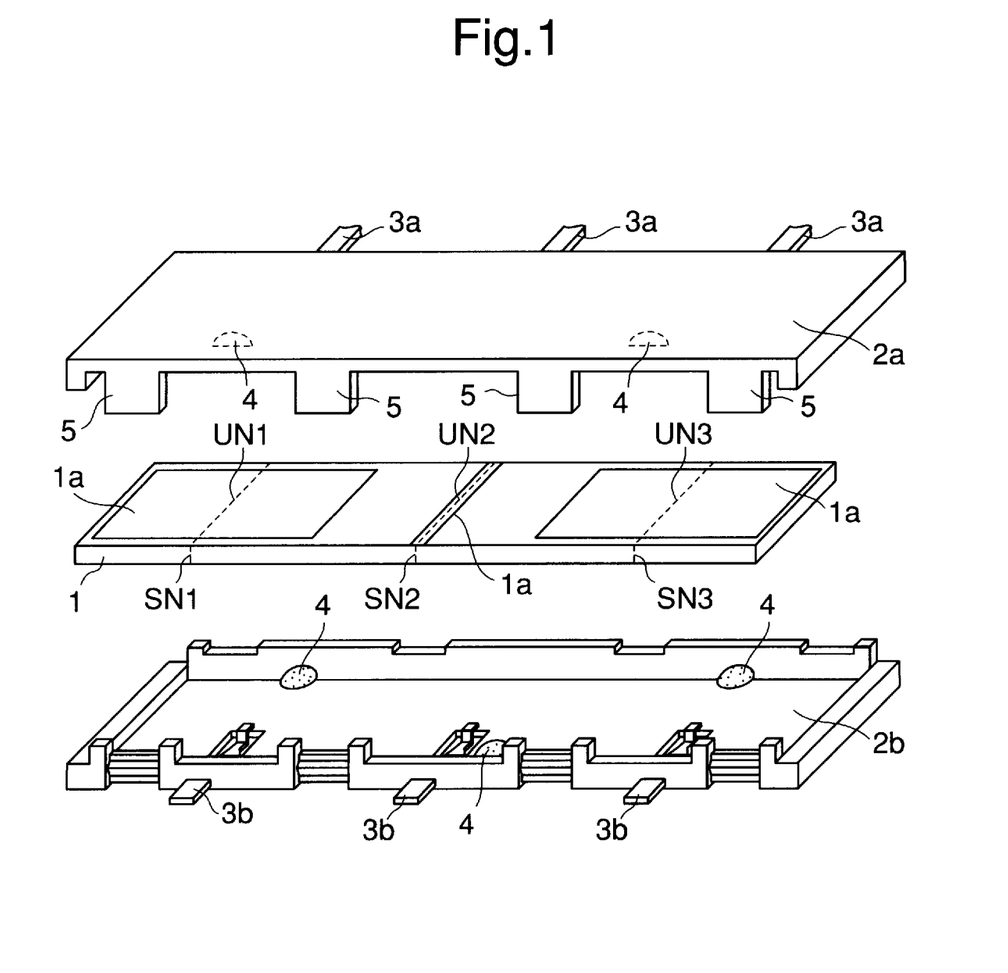
FIG. 1 is an exploded perspective view illustrating a first embodiment of the present invention.
Figure 2:
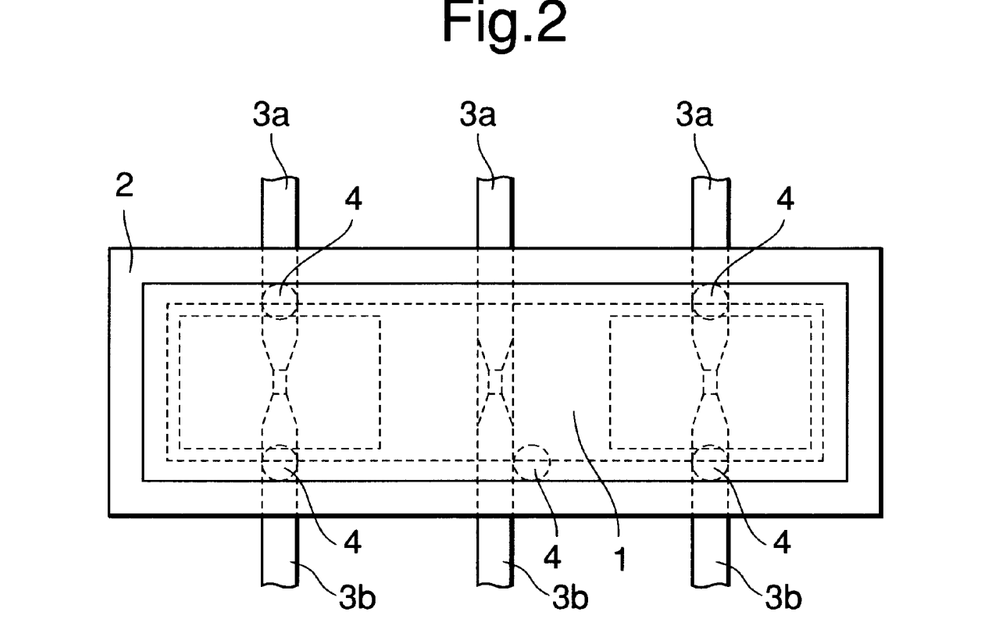
FIG. 2 is a top view illustrating the first embodiment of the present invention.

FIG. 1 is an exploded perspective view illustrating a piezoelectric transformer unit in accordance with a first embodiment of the present invention. FIG. 2 is a top view illustrating a positional relationship between components of the unit.

As shown in the figures, the piezoelectric transformer unit comprises a piezoelectric transformer element 1, a casing 2 having an upper case 2a and a lower case 2b, upper lead terminals 3a, lower lead terminals 3b, elastic adhesive 4, and snap fit fingers 5.

The upper lead terminals 3a are insert-molded in the upper case 2a, and the lower lead terminals 3b are insert-molded in the lower case 2b. The snap fit fingers 5 protrude from the upper case 2a and mate with finger recesses 5a in the lower case 2b in a snap fit fashion to secure the cases 2a and 2b together.

When the transformer element 1 vibrates, nodal regions within the element 1 exist at which the amplitude of the vibrations is a minimum. In the example shown in FIG. 1, some of the nodal regions correspond to the vertical cross sectional area of the element 1 at approximately the mid-points of the upper electrodes 1a taken along the longer side of the element 1. For instance, with respect to the left portion of the element 1, a first nodal region intersects the leftmost upper electrode 1a at an upper nodal line UN1 which is perpendicular to both of the longer side walls of the element 1 and which roughly bisects the leftmost upper electrode 1a. Also, the first nodal region intersects the leftmost lower electrode (not shown) at a lower nodal line (not shown) which is perpendicular to both of the longer side walls of the element 1 and which roughly bisects the rightmost lower electrode (not shown). Finally, the nodal region intersects the longer side walls of the element 1 at side nodal lines SN1, each of which connect the upper nodal line UN1 and the lower nodal line (not shown). FIG. 1 also illustrates second and third nodal regions which respectively form second and third nodal lines UN2 and SN2 and UN3 and SN3 at the cross sectional mid-points of the middle and rightmost upper electrodes 1a. In addition, one of ordinary skill in the art can easily determine where the nodal regions of the element 1 exist.

Pieces of elastic adhesive 4 are applied to the upper case 3a at two locations and are applied to the lower case 3b at three locations. In particular, each piece of elastic adhesive 4 is located along the side wall of the case 2a (or 2b) at a point which coincides with a nodal line of the transformer element 1.

The element 1 is housed within the casing 2 by sandwiching the element 1 between the upper and lower cases 2a and 2b and snap fitting the fingers 5 into the finger recesses 5a. When the element 1 is housed in the casing 2, it is attached to the upper case 2a and the lower case 2b via the elastic adhesive 4. As a result, the element 1 is adhesively and elastically secured to the casing 2 without directly contacting the inner walls of the cases 2a and 2b.

Figure 3:
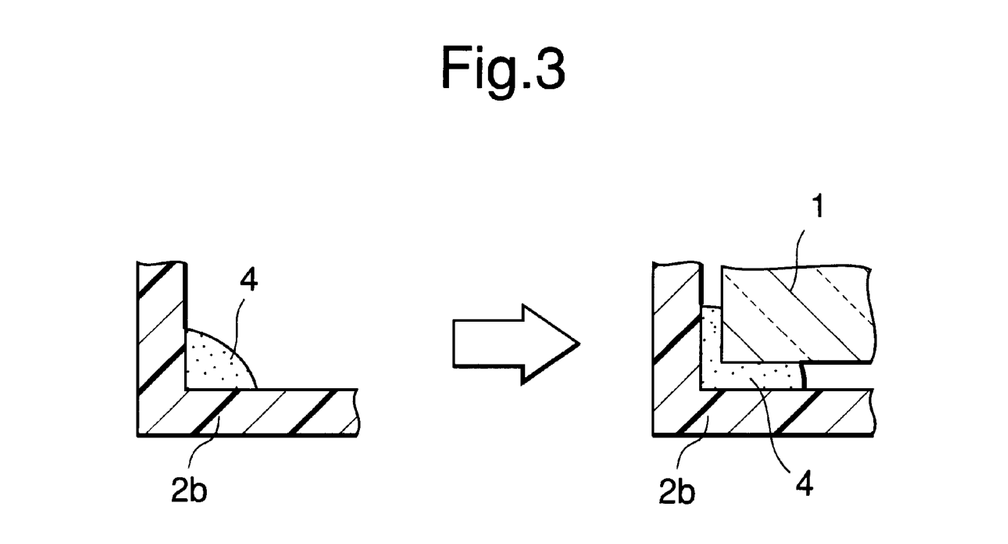
FIG. 3 is an enlarged view illustrating a method for securing a piezoelectric transformer element to a casing in the first embodiment of the present invention.

FIG. 3 is an enlarged diagram showing an illustrative example of the manner in which the piezoelectric transformer element 1 is secured within the casing 2. First, the elastic adhesive 4 is applied to the lower case 2b at the various locations described above. Then, the piezoelectric transformer element 1 is lowered into the lower case 2b, and the adhesive 4 surrounds the corner edges of the element 1 to securely and elastically fasten the element to lower case 2b. In particular, the adhesive 4 contacts nodal lines of the element 1, and the points at which the adhesive 4 contacts the nodal lines can be considered nodal points. Also, due to the existence of the adhesive 4, a certain distance exists between the piezoelectric transformer element 1 and the inner walls of the lower case 2b. Afterwards, the elastic adhesive 4 is applied to the inner walls of the upper case 2a at the locations described above, and the upper case 2a is lowered towards the element 1 and mounted to the lower case 2b. As in the situation of the lower case 2b, the adhesive 4 contained in the upper case 2a surrounds the corner edges of the element 1 to securely and elastically fasten the element 1 to upper case 2a. Furthermore, the adhesive 4 contacts the element 1 at various nodal points.

As described above, the piezoelectric transformer element 1 is elastically held in the casing 2 via the adhesive 4 and does not directly touch the casing 2. As a result, the oscillation of the piezoelectric transformer element 1 is not obstructed, and no noise is created, even if the unit is jolted.

First example

In order to illustrate the advantages of the first embodiment, a first example of such embodiment will be specifically described. In the example, the piezoelectric transformer element 1 has a length $L_P$ which equals 42 mm, a width $W_P$ which equals 5.5 mm, and a thickness $t_p$ which equals 1 mm. Also, when the upper and lower cases 2a and 2b are secured together, the casing 2 has a length $L_C$ equal to 44.4 mm, a width $W_C$ equal to 7.8 mm, and thickness $t_c$ equal to 3.2 mm. Also, the material from which the casing 2 is molded is a liquid crystal polymer that is made by Dupont and is known as Zenite 7130.

Figure 4:
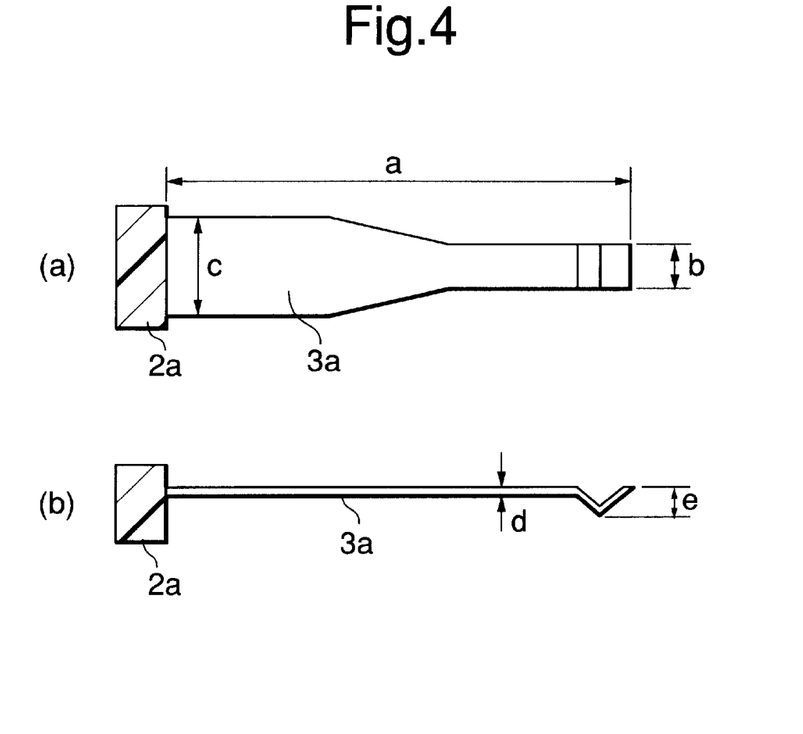
FIG. 4(a) shows a top view illustrating an upper lead terminal used in the various examples of the present invention.
FIG. 4(b) shows a side view illustrating the upper lead terminal used in the various examples of the present invention.

FIGS. 4(a) and 4(b) are respective top and side views of the upper lead terminal 3a. The length $a_{UL}$ from the inner surface of the side wall of the upper case 2a to the tip of the lead terminal 3a equals 3.1 mm, and the width of the tip $b_{UL}$ equals 0.4 mm. Also, the width $c_{UL}$ of the portion of the upper lead terminal 3a which is adjacent to the upper case 2a equals 1.0 mm and is wider than the width $b_{UL}$ of the tip to provide the terminal 3a with strength as a spring material. Also, the lead terminal 3a is made of a phosphor bronze having a thickness $d_{UL}$ which equals 0.1 mm and is nickel-plated to a thickness of 2 to 5 $\mu$m. Furthermore, as shown in FIG. 4(b), the tip of the upper lead terminal 3a has a "V" shaped step having a height $e_{UL}$ which equals 0.45 mm. The dimension of the height $e_{UL}$ includes the dimension of the thickness $d_{UL}$ of the terminal 3a.

The upper lead terminal 3a contacts the piezoelectric transformer element 1 with the bottom edge of the "V" shaped step and thus, contacts the element along a line having a length equal to the length $b_{UL}$ of the step (i.e. 0.4 mm). With respect to the spring-like properties of the upper lead terminal 3a, it contacts the piezoelectric transformer element 1 with a vertical push stroke of about 0.5 mm and a pressure force of 50 to 60 gf.

Figure 5:
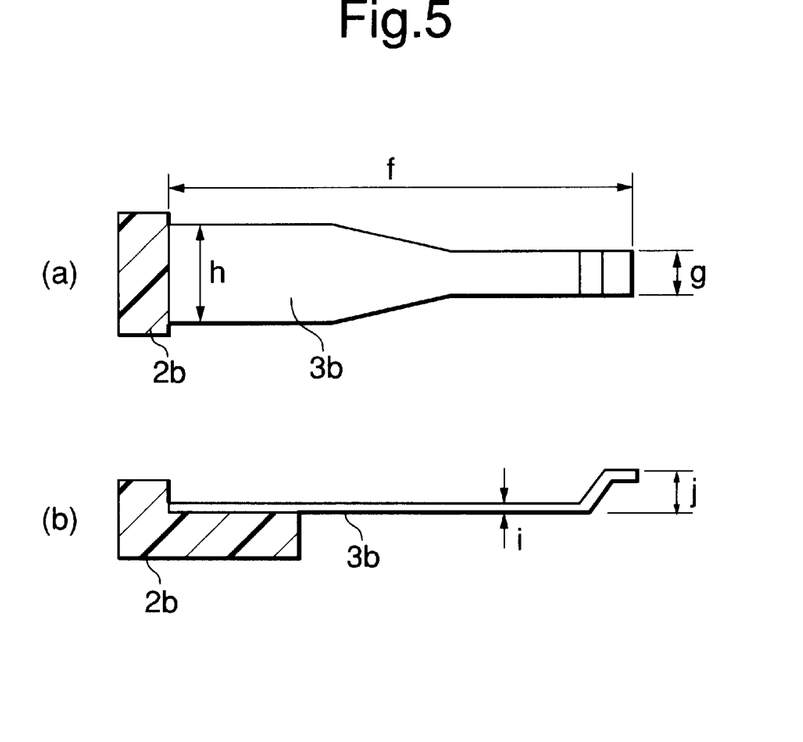
FIG. 5(a) shows a top view illustrating a lower lead terminal used in the various examples of the present invention.
FIG. 5(b) shows a side view illustrating the lower lead terminal used in the various examples of the present invention.

FIGS. 5(a) and 5(b) are respective top and side views of the lower lead terminal 3b. The length $f_{LL}$ from the inner surface of the side wall of the lower case 2b to the tip of the lead terminal 3b equals 3.1 mm, and the width of the tip $g_{LL}$ equals 0.4 mm. Also, the width $h_{LL}$ of the portion of the lower lead terminal 3b which is adjacent to the lower case 2b equals 1.0 mm and is wider than the width $g_{LL}$ of the tip to provide the terminal 3b with strength as a spring material. As in the case of the upper lead terminal 3a, the lower lead terminal 3b is made of a phosphor bronze having a thickness $i_{LL}$ which equals 0.1 mm and is nickel-plated to a thickness of 2 to 5 $\mu$m. Moreover, as shown in FIG. 5(b), the tip of the lower lead terminal 3b has a "Z" shaped step having a height $j_{LL}$ which equals 0.6 mm. The dimension of the height $j_{LL}$ includes the dimension of the thickness $i_{LL}$ of the terminal 3b.

The lower lead terminal 3b contacts the piezoelectric transformer element 1 with the upper surface of the "Z" shaped step which has an area equal to 0.25 mm². The spring-like properties of the lower lead terminal 3b are the same as the properties of the upper lead terminal 3a. Namely, the terminal 3b contacts the piezoelectric transformer element 1 with a vertical push stroke of about 0.5 mm and a pressure force of 50 to 60 gf.

With respect to the elastic adhesive 4, a silicone related adhesive having excellent elasticity and adhesion and having a hardness of 30 to 80 after molding (according to JIS K 6253) is used. An example of such an adhesive is a product called White Sealer which is manufactured by HOLTS. In the present example, a piece of elastic adhesive 4 having a volume from 0.25 ml to 0.75 ml is deposited at each location on the inner surface of the upper and lower case 2a and 2b. Also, the contact area between the piezoelectric transformer element 1 and each piece of the elastic adhesive 4 is adjusted to equal from 0.5 mm² to 1.5 mm² after the element 1 is placed in contact with the adhesive 4.

After a piezoelectric transformer unit having the above dimensions and properties was created, various tests were conducted to determine the quality and reliability of the unit. Specifically, a noise level evaluation, an electrical characteristic evaluation, a vibration test, an impact test, and a reliability test were performed, and the following results were obtained.

With respect to the noise level evaluation, the noise levels of the piezoelectric transformer units corresponding to the present example and the noise levels of conventional units (e.g. the unit illustrated in FIG. 12) were measured. The noise levels of the units of the present example were all background noise level, but some of the conventional units had noise levels which were several dB to 10 dB higher than the background noise level. Specifically, about 30% of the conventional units had the higher noise levels.

With respect to the electrical characteristic evaluation, the energy conversion efficiency of the piezoelectric units of the present embodiment was 95% or higher. Such result is just as good as the efficiency of the conventional units in which the piezoelectric transformer element is held only by the lead terminals.

The vibration test was conducted on 20 units that were manufactured in accordance with the present example. During the test, vibrations of 3 G and cycles of 15 Hz to 1 kHz were applied to each transformer unit in the X, Y, and Z directions of the piezoelectric transformer element 1. Specifically, the vibrations were applied for 120 cycles in the X direction, 120 cycles in the Y direction, and 120 cycles in the Z direction. Since each cycle has a duration of one minute, the vibrations were applied to each side of each unit for two hours. After the vibration test, the noise level and the electrical characteristics of each of the units were the same as the noise levels and electrical characteristics before the vibration test. Therefore, the piezoelectric units were virtually unaffected by the vibrations.

The impact test was also conducted on 20 piezoelectric transformer units that were manufactured in accordance with the present example. During the test, an impact of 100 G lasting 10 msec was repeatedly applied in the −X, +X, −Y, +Y, −Z, and Z directions of the piezoelectric transformer element 1. Specifically, the impact was applied to each unit 10 times in each direction (i.e. a total of 60 times). As in the vibration test, no change occurred in the noise level and the electrical characteristics of the units before and after the impact test. Thus, the piezoelectric transformer units of the present embodiment have an excellent reliability against external stress.

The reliability test was conducted on 20 units, and the units were subjected to high temperatures, low temperatures, and thermal shocks. The reliability test indicated no increase in the noise level or decrease in energy conversion efficiency of the piezoelectric transformer units. As a result, they have an excellent reliability against environmental variations.

Tests and evaluations similar to the ones described above were also conducted on piezoelectric transformer units in which the contact area between the piezoelectric transformer element 1 and each piece of elastic adhesive 4 was less than 0.5 mm$^2$. (In such case, the coated volume of the elastic adhesive 4 is less than 0.25 ml). The electrical characteristic evaluation of the energy conversion efficiency of the units was the same as the results of the units manufactured in accordance with the present example. However, noise occurred at an occurrence ratio of about 5%. Also, after the vibration and impact tests, noise occurred at an occurrence ratio of about 15%.

Also, similar evaluations were performed on units in which the contact area between the piezoelectric transformer element 1 and each piece of elastic adhesive 4 was larger than 1.5 mm$^2$. (In such case, the coated volume of the elastic adhesive 4 is greater than 0.75 ml). With respect to the noise level evaluation, the vibration test, the impact test, and the reliability test, the units performed as well as the units manufactured in accordance with the present example. However, the electrical characteristic evaluation revealed that the energy conversion efficiency of the units was lower than 90%.

In order to evaluate the effect of the hardness of the elastic adhesive 4, units were manufactured with an adhesive 4 having a hardness lower than 30, and such units were too soft to adequately hold the element 1 within the casing 2. Also, units were manufactured with an adhesive 4 having a hardness higher than 80, and such units had an energy conversion efficiency of less than 90%.

The test results discussed above were obtained by testing units having an adhesive 4 made of a silicone-related material. Furthermore, the same results occurred when units having an adhesive made of a urethane-related material were tested.

Second embodiment

Figure 6:
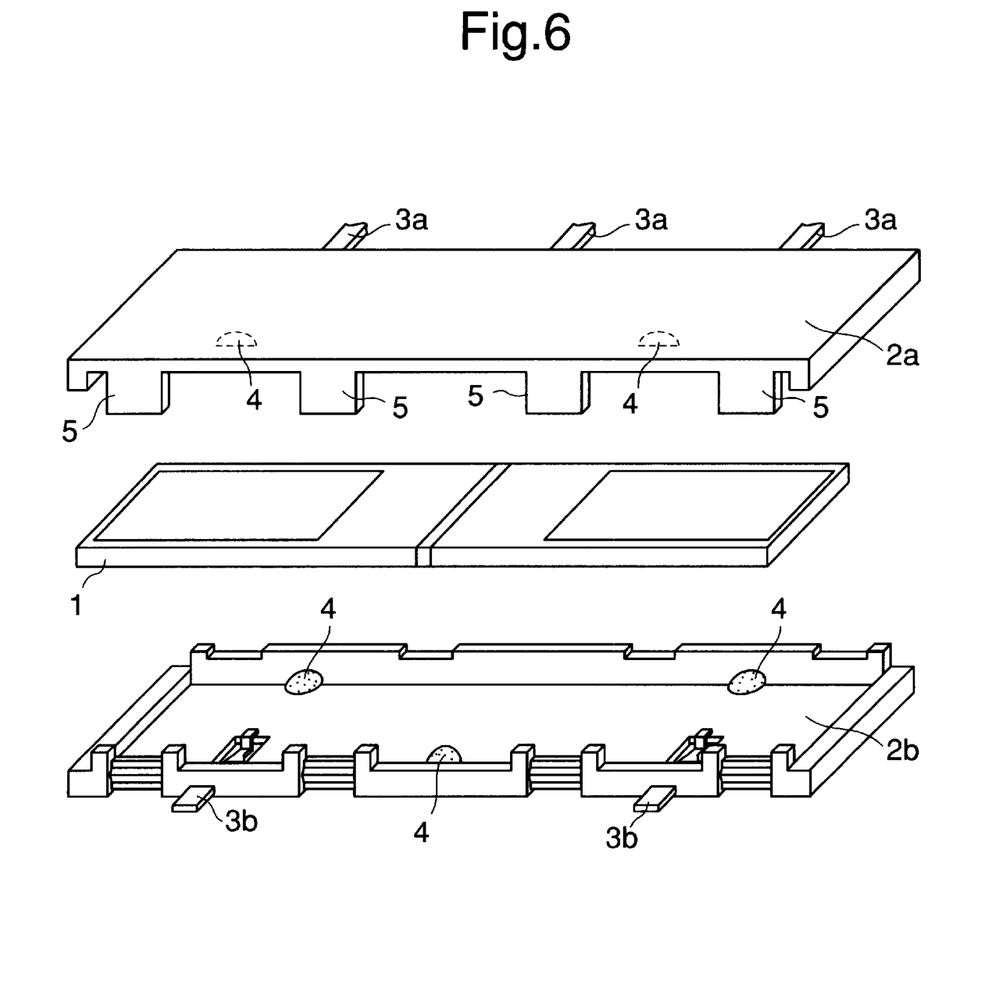
FIG. 6 is an exploded perspective view illustrating a second embodiment of the present invention.

FIG. 6 is an exploded perspective view illustrating a second embodiment of the present invention. The second embodiment differs from the first embodiment in that the electrode 11a at the center of the piezoelectric transformer element 1 is continuously formed around the outer surface of the element 1. Also, the second embodiment is different because it does not have a lower lead terminal 3b which contacts the electrode 11a in the center of the piezoelectric transformer element 1. Also, a piece of elastic adhesive 4 is applied at a position corresponding to the midpoint of the length of the piezoelectric transformer element 1, whereas the corresponding piece of adhesive 4 is positioned slightly off the midpoint position.

Second example

In the second example, the piezoelectric transformer element 1, the casing 2, and the lead terminals 3a and 3b have the same shapes and dimensions as the shapes and dimensions discussed in conjunction with the first example.

With respect to the elastic adhesive 4, White Sealer was used and was applied to the upper case 2b at two positions and to the lower case 2b at three positions. Also, each piece of elastic adhesive 4 having a volume from 0.25 ml to 0.75 ml was deposited at each location on the inner surface of the upper and lower cases 2a and 2b. Also, the contact area between the piezoelectric transformer element 1 and each piece of the elastic adhesive 4 was adjusted to equal from 0.5 mm$^2$ to 1.5 mm$^2$ after the element 1 was placed in contact with the adhesive 4.

The piezoelectric transformer units were also subjected to the noise level evaluation, the electrical characteristic evaluation, the vibration test, the impact test, and the reliability test. The results obtained during the testing of the second example were similar to the results obtained during the testing of the first example.

As described above, in the first example, the elastic adhesive 4 is attached to the central lower lead terminal 3b and thus, may adversely alter the force with which the lead terminal 3b presses against the piezoelectric transformer element. On the other hand, in the second example, the central lower lead terminal 3b has been removed to allow the elastic adhesive to be applied to the center position. Therefore, the above problem is eliminated, and the manufacturing efficiency of the piezoelectric transformer unit is increased.

Third embodiment

Figure 7:
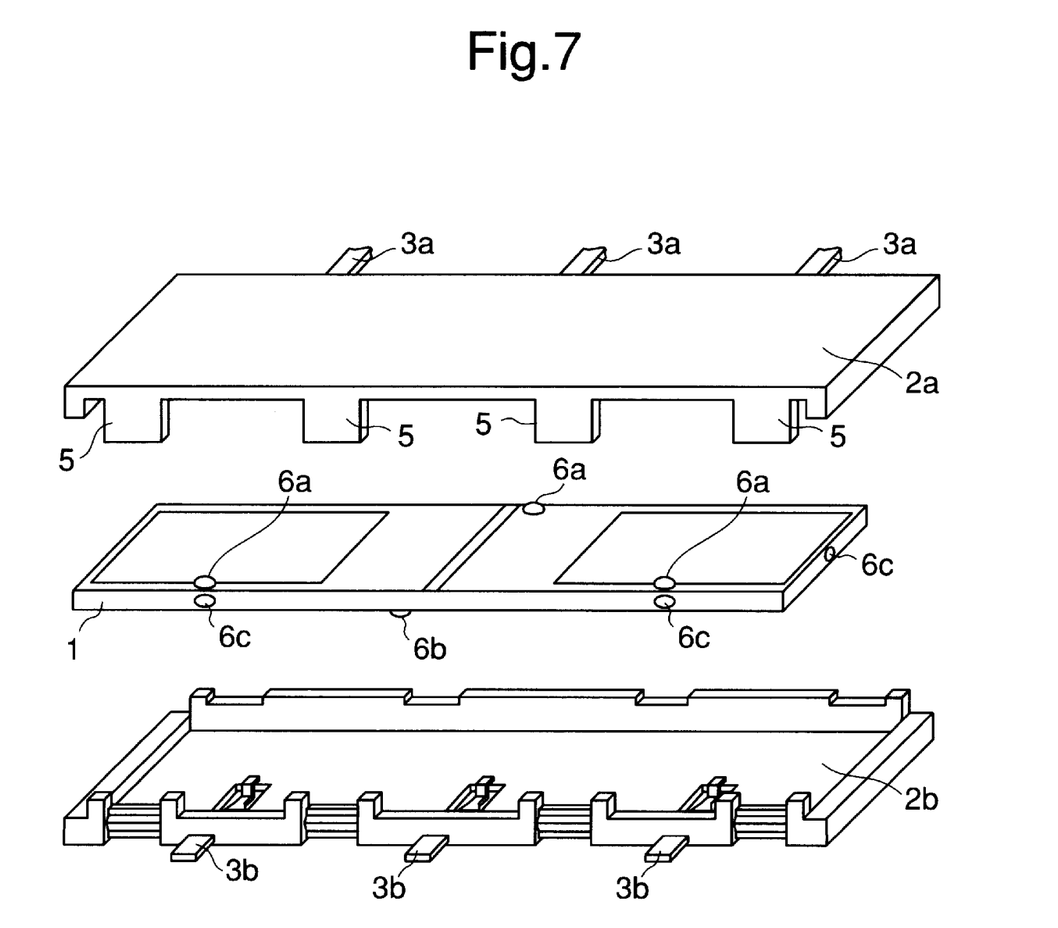
FIG. 7 is an exploded perspective view illustrating a third embodiment of the present invention.
Figure 8:
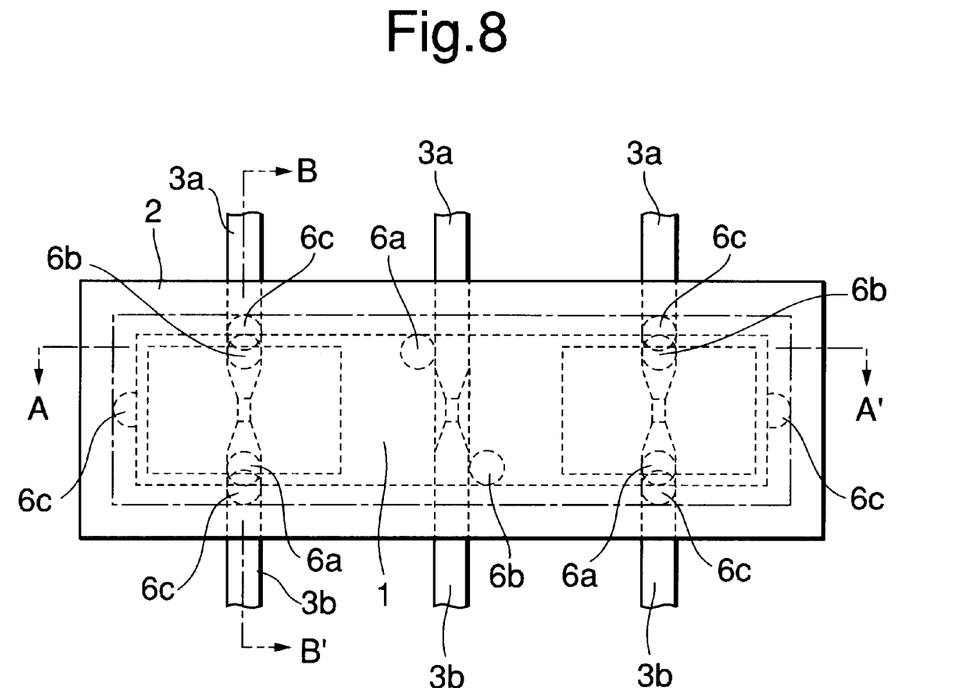
FIG. 8 is a top view illustrating the third embodiment of the present invention.
Figure 9:
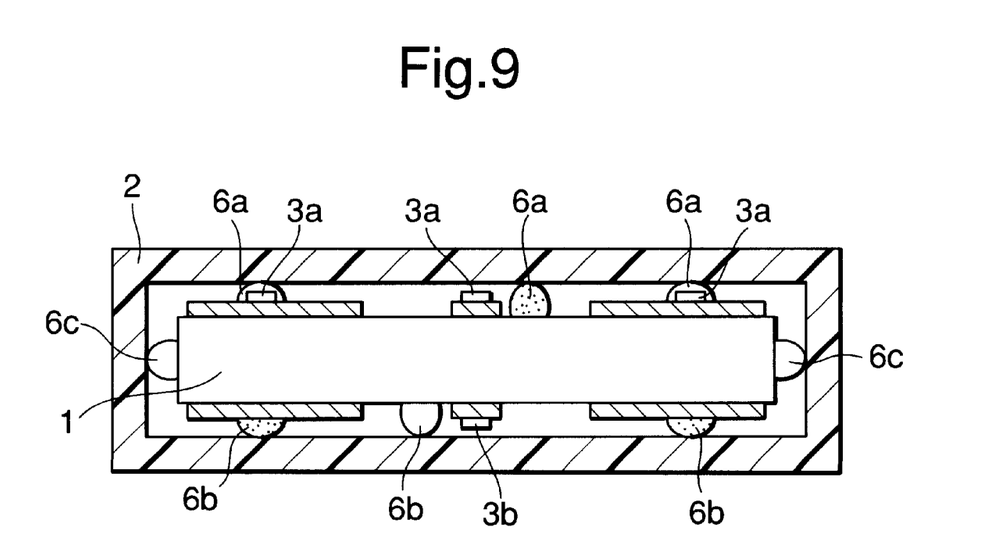
FIG. 9 is a cross sectional view taken along line A–A' of FIG. 8.
Figure 10:
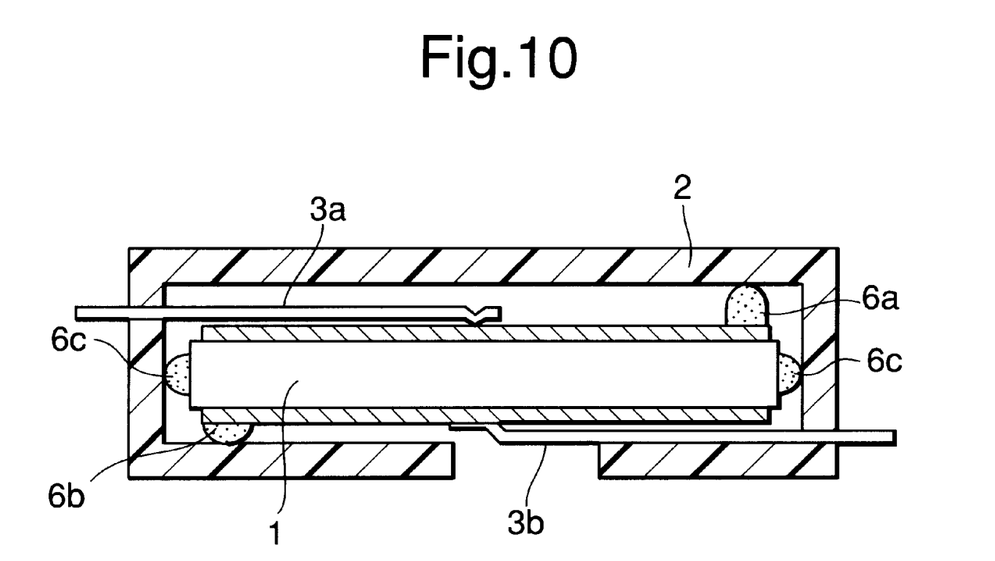
FIG. 10 is a cross sectional view taken along line B–B' of FIG. 8.

FIG. 7 is an exploded perspective view illustrating a third embodiment of the present invention, and FIG. 8 is a top view illustrating a positional relationship between various components of the third embodiment. Also, FIG. 9 is a cross sectional view taken along the line A–A' of FIG. 8, and FIG. 10 is a cross sectional view taken along the line B–B' of FIG. 8. Also, in FIGS. 7 to 10, components which are the same or similar to the components described in conjunction with FIGS. 1 to 6 are denoted by the same reference numerals, and a description of such components is omitted for the sake of brevity.

In the third embodiment, the elastic adhesive 4 used in the first and second embodiments is not used. Instead, conical or spheroidal elastic projections made of rubber material such as silicone rubber or urethane rubber are arranged and formed at nodal points on the front, rear, and side surfaces of the piezoelectric transformer element 1 by a screen printing process or similar process. For example, as shown in FIGS. 7 to 10, upper elastic projections 6a are arranged on the upper surface of the piezoelectric transformer element 1, lower elastic projections 6b are arranged on the lower surface, and side elastic projections 6c are arranged on the side surfaces. Also, when the upper and lower cases 2a and 2b are mounted together and sandwich the element 1, the projections 6a, 6b, and 6c do not need to contact the side walls of the cases 2a and 2b. The elastic projections are made of a material comprising one of silicone and urethane and has a hardness of 30 to 80 according to JIS K 6253.

Third example

In the third example, the piezoelectric transformer element 1, the casing 2, and the lead terminals 3a and 3b have the same shapes and dimensions as the shapes and dimensions discussed in conjunction with the first and second examples.

Figure 11A:
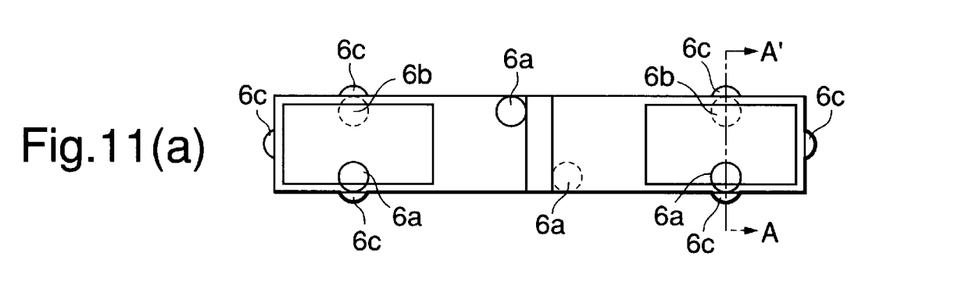
FIG. 11(a) shows a top view illustrating a piezoelectric transformer element of a third example of the present invention.
Figure 11B:
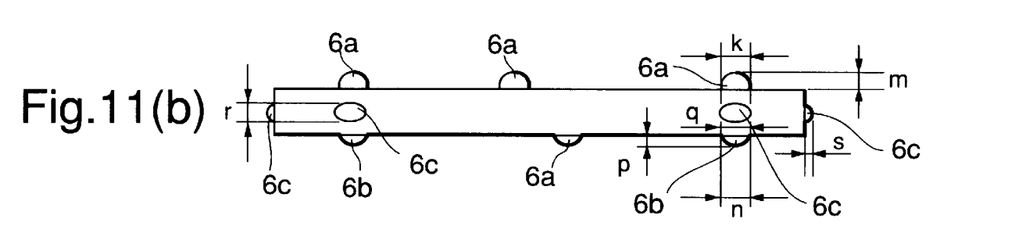
FIG. 11(b) shows a side view illustrating the piezoelectric transformer element of the third example.
Figure 11C:
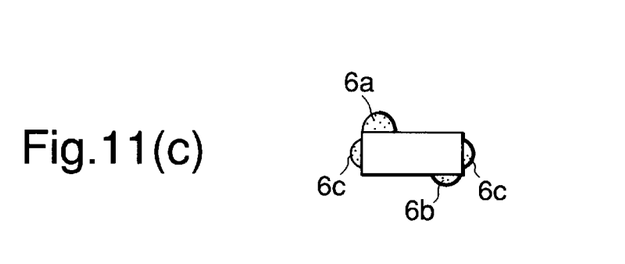
FIG. 11(c) shows a cross sectional view taken along line A–A' of FIG. 11(a)

FIG. 11 shows a top view, a side view, and a cross sectional view illustrating the positions of the elastic projections 6a, 6b, and 6c printed on the piezoelectric transformer element 1. As shown in the figure, the elastic projections 6a, 6b, and 6c are provided at a total of 12 positions on the element 1. Three upper elastic projections 6a are formed on the upper surface of the element 1, three lower elastic projections 6b are formed on the lower surface, four side elastic projections 6c are formed on the long side surfaces of the element 1, and two side elastic projections 6c are formed on the short side surfaces.

As shown in FIG. 11, each upper elastic projection 6a has a diameter $k_{UEP}$ which equals 1.0 mm and a height $m_{UEP}$ which equals 0.35 mm. Each lower elastic projection 6b has a diameter $n_{LEP}$ which equals 1.0 mm and a height $p_{LEP}$ which equals 0.25 mm. Each side elastic projection 6c has a conical shape with an elliptical base. The long axis of the elliptical base has a length $q_{SEP}$ which equals 1.0 mm and a short axis length $r_{SEP}$ which equals 0.5 mm. Also, each projection 6c has a height $s_{SEP}$ which equals 0.1 mm.

By disposing the elastic projections 6a, 6b, and 6c on the element, the piezoelectric transformer unit generates an extremely small amount of noise during operation because the projections 6a, 6b, and 6c prevent the element 1 from directly touching the casing 2. Also, although not shown in FIG. 9, a gap of 0.03 mm to 0.1 mm is preferably provided between at least one of the elastic projections 6a, 6b, and 6c and the casing 2. For example, some of the projections (e.g. the three lower elastic projections 6b and the rightmost elastic projection 6c) may contact the casing 2 without pressure, and some of the projections (e.g. the three upper elastic projections 6a and the leftmost elastic projection 6c) may be separated from the casing 2 by a gap of 0.03 mm to 0.1 mm. Therefore, the oscillation of the piezoelectric transformer element 1 is not hindered, and the piezoelectric transformer unit has an excellent electrical characteristic. Furthermore, not only is the element held by the lead terminals 3a and 3b, but it is also protected by the elastic projections 6a, 6b, and 6c, and thus, the piezoelectric transformer unit has a very high resistance to external stress.

Also, unlike the first and second examples, the height of the elastic projections 6a, 6b, and 6c can be adjusted by changing the printing quantity of the screen printing operation or by changing similar quantities of similar operations. Thus, the heights of the projections can be adjusted based on the gap between the piezoelectric transformer element 1 and the casing 2. Therefore, the design of the piezoelectric transformer element 1 can be easily modified so that it can fit in many differently sized casings 2.

Piezoelectric transformer units made in accordance with the third example were also subjected to the noise level evaluation, the electrical characteristic evaluation, the vibration test, the impact test, and the reliability test. The results obtained during the testing of the third example were similar to the results obtained during the testing of the first and second examples.

Fourth example

In the fourth example, the piezoelectric transformer element 1, the casing 2, and the lead terminals 3a and 3b have the same shapes and dimensions as the shapes and dimensions discussed in conjunction with the first, second, and third example.

In the fourth example, the upper and lower elastic projections 6a and 6b used in the third example are removed, and only the side elastic projections 6c are formed on the side surfaces of the piezoelectric transformer element 1. Also, the elastic adhesive 4 is applied to the upper case 2a and the lower case 2b at the positions described above in conjunction with the first example, and the piezoelectric transformer element 1 is adhesively attached at the upper and lower surfaces to the casing 2. However, in the fourth example, the adhesive 4 is prevented from spreading around the sides of the piezoelectric transformer element 1. The dimensions of the side elastic projections 6c are the same as the projections 6c used in the third example, and six projections 6c are placed around the side surfaces of the element 1 as described in the third example.

Piezoelectric transformer units made in accordance with the fourth example were subjected to the noise level evaluation, the electrical characteristic evaluation, the vibration test, the impact test, and the reliability test. The results obtained during the testing of the fourth example were similar to the results obtained during the testing of the first, second, and third examples.

In the illustrative embodiments and examples described above, the piezoelectric transformer unit has a piezoelectric transformer element which is pressed and held by upper and lower lead terminals at its nodal points and is held by elastic members which are provided at nodal points between the element and a casing. As a result, the unit has many advantages.

For example, the piezoelectric transformer element does not directly contact the casing because it is protected by the elastic members. Therefore, if the piezoelectric transformer element generates an oscillation that has a frequency in audible sound range, the oscillation does not propagate to the casing, and the amount of noise caused by operating the piezoelectric transformer unit is dramatically reduced.

Also, the piezoelectric transformer element is held at its nodal points by an elastic member which is relatively soft and which contacts the element at a limited contact area. As a result, the oscillation of the piezoelectric transformer element is not hindered, and the piezoelectric transformer unit has excellent electrical characteristics.

In addition, if an external vibration or impact is applied to the unit, the piezoelectric transformer element does not shift with respect to the casing. Therefore, points at which the lead terminals contact the piezoelectric transformer element do not shift from the nodal points, and the conversion efficiency of the piezoelectric transformer unit is maintained.

Also, if an external vibration or impact is applied to the unit, the piezoelectric transformer element is protected from abutting against the casing. Thus, noise which would have been caused by such collision is avoided.

The previous description of the preferred embodiments is provided to enable a person skilled in the art to make or use the present invention. Moreover, various modifications to these embodiments will be readily apparent to those skilled in the art, and the generic principles defined herein may be applied to other embodiments without the use of inventive faculty. Therefore, the present invention is not intended to be limited to the embodiments described herein but is to be accorded the widest scope as defined by the claims.

What is claimed:

1. A piezoelectric transformer unit, comprising:
   a piezoelectric transformer element having a upper element surface, a lower element surface, and a first side element surface;
   a first upper electrode formed on said upper element surface of said piezoelectric transformer element;
   a first lower electrode formed on said lower element surface of said piezoelectric transformer element;
   an insulator casing which houses said piezoelectric transformer element;
   a first lead terminal which protrudes from an inner surface of said insulator casing, supports said piezoelectric transformer element within said insulator casing, and vertically presses an oscillation nodal point of said piezoelectric transformer element; and
   first, second, third, and fourth elastic adhesives, wherein said first to fourth elastic adhesives are respectively located at first to fourth oscillation nodal points of said piezoelectric transformer element,
   wherein said first elastic adhesive is disposed next to an upper casing surface and a first side casing surface of said insulator casing and is disposed next to said upper element surface and said first side element surface of said piezoelectric transformer element,
   wherein said second elastic adhesive is disposed next to said upper casing surface and said first side casing surface and is disposed next to said upper element surface and said first side element surface, wherein said third elastic adhesive is disposed next to a lower casing surface and a second side casing surface of said insulator casing and is disposed next to said lower element surface and a second side element surface of said piezoelectric transformer element, and wherein said fourth elastic adhesive is disposed next to said lower casing surface and said second side casing surface and is disposed next to said lower element surface and said second side element surface.

2. The piezoelectric transformer unit as claimed in claim 1, wherein said first elastic adhesive is substantially disposed at a mid point of a dimension of said first upper electrode, wherein said dimension of said first upper electrode is parallel to said first side element surface, and wherein said third elastic adhesive is substantially disposed at a mid point of a dimension of said first lower electrode, wherein said dimension of said first lower electrode is parallel to said second side element surface.

3. The piezoelectric transformer unit as claimed in claim 2, wherein said piezoelectric transformer element has a second upper electrode disposed on said upper element surface and a second lower electrode disposed on said lower element surface, wherein said second elastic adhesive is substantially disposed at a mid point of a dimension of said second upper electrode, wherein said dimension of said second upper electrode is parallel to said first side element surface, and wherein said fourth elastic adhesive is substantially disposed at a mid point of a dimension of said second lower electrode, wherein said dimension of said second lower electrode is parallel to said second side element surface.

4. The piezoelectric transformer unit as claimed in claim 3, wherein said piezoelectric transformer element has a third upper electrode disposed between said first upper electrode and said second upper electrode and has a third lower electrode disposed between said first lower electrode and said second lower electrode, and wherein a fifth elastic adhesive is disposed between said first and second elastic adhesives and is disposed next to said lower casing surface and said first side casing surface and is disposed next to said lower element surface and said first side element surface.

5. The piezoelectric transformer unit as claimed in claim 4, wherein respective ends of said third upper electrode and said third lower electrode are connected via a side electrode on one of said first and second side element surfaces, and wherein said first lead terminal is a first lower lead terminal which contacts said first lower electrode, wherein a first upper lead terminal is disposed above said first lower lead terminal and contacts said first upper electrode, wherein a second upper lead terminal contacts said third upper electrode, and wherein no lead terminal contacts said third lower electrode.

6. A piezoelectric transformer unit, comprising:

a piezoelectric transformer element having a upper element surface, a lower element surface, and a first side element surface;

a first upper electrode formed on said upper element surface of said piezoelectric transformer element;

a first lower electrode formed on said lower element surface of said piezoelectric transformer element;

an insulator casing which houses said piezoelectric transformer element;

a first lead terminal which protrudes from an inner surface of said insulator casing, supports said piezoelectric transformer element within said insulator casing, and vertically presses an oscillation nodal point of said piezoelectric transformer element; and an insulator elastic member arranged between an oscillation nodal point on one of said upper, lower, and first side element surfaces of said piezoelectric transformer element and said insulator casing, wherein said insulator elastic member comprises:

a first elastic projection projecting from said one of said upper, lower, and first side element surfaces of said piezoelectric transformer element.

7. The piezoelectric transformer unit as claimed in claim 6, further comprising:

a second elastic projection, wherein said first and second elastic projections are respectively located at first and second oscillation nodal points of said piezoelectric transformer element.

8. The piezoelectric transformer unit as claimed in claim 7, wherein said first elastic projection is a first side elastic projection and is disposed next to a first side casing surface of said insulator casing and projects from said first side element surface of said piezoelectric transformer element, and wherein said second elastic projection is a second side elastic projection and is disposed next to a second side casing surface of said insulator casing and projects from a second side element surface of said piezoelectric transformer element.

9. The piezoelectric transformer unit as claimed in claim 8, further comprising:

third and fourth side elastic projections, wherein said fourth side elastic projections are respectively located at third and fourth oscillation nodal points of said piezoelectric transformer element, wherein said third side elastic projection is disposed next to said first side casing surface and projects from said first side element surface, and wherein said fourth side elastic adhesive is disposed next to said second side casing surface and projects from said second side element surface.

10. The piezoelectric transformer unit as claimed in claim 9, further comprising:

fifth and sixth side elastic projections, wherein said fifth and sixth side elastic projections are respectively located at fifth and sixth oscillation nodal points of said piezoelectric transformer element, wherein said fifth side elastic projection is disposed next to a third side casing surface of said insulator casing and projects from a third side element surface of said piezoelectric transformer element, and wherein said sixth side elastic projection is disposed next to a fourth side casing surface of said insulator casing and projects from a fourth side element surface of said piezoelectric transformer element.

11. The piezoelectric transformer unit as claimed in claim 10, wherein said first side element surface opposes said second side element surface and wherein said third side element surface opposes said fourth side element surface.

12. The piezoelectric transformer unit as claimed in claim 10, wherein said first side elastic projection is substantially disposed at a first mid point of a first dimension of said first upper electrode, wherein said first dimension of said first upper electrode is parallel to said first side element surface, and wherein said second side elastic projection is substantially disposed at a second mid point of a second dimension of said first upper electrode, wherein said second dimension of said first upper electrode is parallel to said second side element surface.

13. The piezoelectric transformer unit as claimed in claim 12, wherein said piezoelectric transformer element has a second upper electrode disposed on said upper element surface and a second lower electrode disposed on said lower element surface, wherein said third side elastic projection is substantially disposed at a first mid point of a first dimension of said second upper electrode, wherein said first dimension of said second upper electrode is parallel to said first side element surface, and wherein said fourth side elastic projection is substantially disposed at second a mid point of a second dimension of said second upper electrode, wherein said second dimension of said second upper electrode is parallel to said second side element surface.

14. The piezoelectric transformer unit as claimed in claim 13, wherein said fifth side elastic projection is substantially disposed at a third mid point of a third dimension of said first upper electrode, wherein said third dimension of said first upper electrode is parallel to said third side element surface, and wherein said sixth side elastic projection is substantially disposed at third a mid point of a third dimension of said second upper electrode, wherein said third dimension of said second upper electrode is parallel to said fourth side element surface.

15. The piezoelectric transformer unit as claimed in claim 14, further comprising:

a first upper elastic projection projecting from said upper surface of said piezoelectric transformer element and disposed next to an upper casing surface of said insulator; and a first lower elastic projection projecting from said lower surface of said piezoelectric transformer element and disposed next to a lower casing surface of said insulator.

16. The piezoelectric transformer unit as claimed in claim 15, further comprising:

a second upper elastic projection projecting from said upper surface of said piezoelectric transformer element and disposed next to said upper casing surface of said insulator; and a third lower elastic projection projecting from said lower surface of said piezoelectric transformer element and disposed next to a lower casing surface of said insulator.

17. The piezoelectric transformer unit as claimed in claim 16, wherein said first upper elastic projection is located between said first upper electrode and said first side element surface, and wherein said second upper elastic projection is located between said second upper electrode and said first side element surface.

18. The piezoelectric transformer unit as claimed in claim 17, wherein said first lower elastic projection is located between said first lower electrode and said second side element surface, and wherein said second lower elastic projection is located between said second lower electrode and said second side element surface.

19. The piezoelectric transformer unit as claimed in claim 18, wherein said first upper elastic projection is substantially directly located above said first side elastic projection, wherein said second upper elastic projection is substantially directly located above said third side elastic projection, wherein said first lower elastic projection is substantially directly located below said second side elastic projection, and wherein said second lower elastic projection is substantially directly located below said fourth side elastic projection.

20. The piezoelectric transformer unit as claimed in claim 19, wherein a third upper electrode is provided on said upper element surface between said first and second upper electrodes, and wherein a third lower electrode is provided on said lower element surface between said first and second lower electrodes, wherein a third upper elastic projection projects from said upper element surface and is located adjacent to a side of said third upper electrode, and wherein a third lower elastic projection projects from said lower element surface and is located adjacent to a side of said third lower electrode.

21. The piezoelectric transformer unit as claimed in claim 20, wherein said third upper elastic projection is disposed next to said second side element surface and said third lower elastic projection is disposed next to said first side element surface.

22. The piezoelectric transformer unit as claimed in claim 14, wherein said insulator elastic member comprises:

first and second upper elastic adhesives applied to an upper casing surface of said insulator casing; and first and second lower elastic adhesives applied to a lower casing surface of said insulator casing.

23. The piezoelectric transformer unit as claimed in claim 22, wherein said first upper elastic adhesive is located between said first upper electrode and said first side element surface, and wherein said second upper elastic adhesive is located between said second upper electrode and said first side element surface.

24. The piezoelectric transformer unit as claimed in claim 23, wherein said first lower elastic adhesive projection is located between said first lower electrode and said second side element surface, and wherein said second lower elastic adhesive is located between said second lower electrode and said second side element surface.

25. The piezoelectric transformer unit as claimed in claim 24, wherein said first upper elastic adhesive is substantially directly located above said first side elastic projection, wherein said second upper elastic adhesive is substantially directly located above said third side elastic projection, wherein said first lower elastic adhesive is substantially directly located below said second side elastic projection, and wherein said second lower elastic adhesive is substantially directly located below said fourth side elastic projection.

26. A piezoelectric transformer unit, comprising:

a piezoelectric transformer element having a upper element surface, a lower element surface, and a first side element surface;

a first upper electrode formed on said upper element surface of said piezoelectric transformer element;

a first lower electrode formed on said lower element surface of said piezoelectric transformer element;

an insulator casing which houses said piezoelectric transformer element;

a first lead terminal which protrudes from an inner surface of said insulator casing, supports said piezoelectric transformer element within said insulator casing, and vertically presses an oscillation nodal point of said piezoelectric transformer element; and an insulator elastic member arranged between an oscillation nodal point on one of said upper, lower, and first side element surfaces of said piezoelectric transformer element and said insulator casing, wherein said insulator elastic member corresponds to a first elastic adhesive applied to said upper casing surface of said insulator casing and wherein said piezoelectric transformer unit, further comprises:

a second elastic adhesive applied to said lower casing surface of said casing;

a first side elastic projection projecting from a first side element surface of said piezoelectric transformer element;

a second side elastic projection projecting from a second side element surface of said piezoelectric transformer element a third side elastic projection projecting from a third side element surface of said piezoelectric transformer element; and a fourth side elastic projection projecting from a fourth side element surface of said piezoelectric transformer element.

27. A piezoelectric transformer unit, comprising:

a piezoelectric transformer element having a upper element surface, a lower element surface, and a first side element surface;

a first upper electrode formed on said upper element surface of said piezoelectric transformer element;

a first lower electrode formed on said lower element surface of said piezoelectric transformer element;

an insulator casing which houses said piezoelectric transformer element;

a first lead terminal which protrudes from an inner surface of said insulator casing, supports said piezoelectric transformer element within said insulator casing, and vertically presses an oscillation nodal point of said piezoelectric transformer element; and an insulator elastic member arranged between an oscillation nodal point on one of said upper, lower, and first side element surfaces of said piezoelectric transformer element and said insulator casing, wherein said insulator elastic member is made of a material comprising one of silicone and urethane and has a hardness of 30 to 80 according to JIS A 5758.

28. A piezoelectric transformer unit, comprising:

a piezoelectric transformer element having a upper element surface, a lower element surface, and a first side element surface;

a first upper electrode formed on said upper element surface of said piezoelectric transformer element;

a first lower electrode formed on said lower element surface of said piezoelectric transformer element;

an insulator casing which houses said piezoelectric transformer element;

a first lead terminal which protrudes from an inner surface of said insulator casing, supports said piezoelectric transformer element within said insulator casing, and vertically presses an oscillation nodal point of said piezoelectric transformer element; and an insulator elastic member arranged between an oscillation nodal point on one of said upper, lower, and first side element surfaces of said piezoelectric transformer element and said insulator casing, wherein a contact area between said insulator elastic member and said piezoelectric transformer element is 0.5 to 1.5 mm$^2$.

29. A piezoelectric transformer unit as claimed in claim 5, wherein each of said first to sixth elastic adhesives is made of a material comprising one of silicone and urethane and has a hardness of 30 to 80 according to JIS K 6253.

30. A piezoelectric transformer unit as claimed in claim 5, wherein a contact area between each of said first to sixth elastic adhesives and said insulator casing is 0.5 to 1.5 mm$^2$.

31. A piezoelectric transformer unit as claimed in claim 5, wherein a contact area between each of said first to sixth elastic adhesives and said piezoelectric transformer element is 0.5 to 1.5 mm$^2$.

32. A piezoelectric transformer unit as claimed in claim 10, wherein each of said first to sixth side elastic projections is made of a material comprising one of silicone and urethane and has a hardness of 30 to 80 according to JIS K 6253.

33. A piezoelectric transformer unit, comprising:

a piezoelectric transformer element having a upper element surface, a lower element surface, and a first side element surface;

a first upper electrode formed on said upper element surface of said piezoelectric transformer element;

a first lower electrode formed on said lower element surface of said piezoelectric transformer element;

an insulator casing which houses said piezoelectric transformer element;

a first lead terminal which protrudes from an inner surface of said insulator casing, supports said piezoelectric transformer element within said insulator casing, and vertically presses an oscillation nodal point of said piezoelectric transformer element;

a first insulator elastic member arranged between an oscillation nodal point on one of said upper, lower, and first side element surfaces of said piezoelectric transformer element and said insulator casing, wherein said first insulator elastic member is substantially disposed at a mid point of a dimension of said first upper electrode, wherein said dimension of said first upper electrode is parallel to said one of said upper, lower, and first side element surfaces of said piezoelectric transformer element; and a second insulator elastic member located next to but not contacting a nodal line of said piezoelectric transformer element, wherein said second insulator elastic member does not substantially suppress piezoelectric oscillation of said piezoelectric transformer element.

34. The piezoelectric transformer unit as claimed in claim 33, further comprising:

a third insulator elastic member arranged between an oscillation nodal point on one of said upper, lower, and first side element surfaces of said piezoelectric transformer element and said insulator casing.

35. The piezoelectric unit as claimed in claim 34, wherein said third insulator elastic member is substantially disposed at a mid point of a dimension of said first lower electrode, wherein said dimension of said first lower electrode is parallel to said one of said upper, lower, and first side element surfaces of said piezoelectric transformer element.

36. A piezoelectric transformer unit, comprising:

a piezoelectric transformer element having a upper element surface, a lower element surface, and a first side element surface;

a first upper electrode formed on said upper element surface of said piezoelectric transformer element;

a first lower electrode formed on said lower element surface of said piezoelectric transformer element;

an insulator casing which houses said piezoelectric transformer element;

a first lead terminal which protrudes from an inner surface of said insulator casing, supports said piezoelectric transformer element within said insulator casing, and vertically presses an oscillation nodal point of said piezoelectric transformer element; and first and second insulator elastic members respectively located at first and second oscillation nodal points of said piezoelectric transformer element, wherein said first insulator elastic member is disposed next to an upper casing surface and a first side casing surface of said insulator casing and is disposed next to said upper element surface and said first side element surface of said piezoelectric transformer element, and wherein said second insulator elastic member is disposed next to said upper casing surface and said first side casing surface and is disposed next to said upper element surface and said first side element surface.

37. A piezoelectric transformer unit, comprising:

a piezoelectric transformer element having a upper element surface, a lower element surface, and a first side element surface;

a first upper electrode formed on said upper element surface of said piezoelectric transformer element;

a first lower electrode formed on said lower element surface of said piezoelectric transformer element;

an insulator casing which houses said piezoelectric transformer element;

a first lead terminal which protrudes from an inner surface of said insulator casing, supports said piezoelectric transformer element within said insulator casing, and vertically presses an oscillation nodal point of said piezoelectric transformer element;

a first insulator elastic member located at a first oscillation nodal point of said piezoelectric transformer element, wherein said first insulator elastic member projects from said first side element surface of said piezoelectric transformer element; and a second insulator elastic member located next to but not contacting a nodal line of said piezoelectric transformer element, wherein said second insulator elastic member does not substantially suppress piezoelectric oscillation of said piezoelectric transformer element.

38. The piezoelectric transformer unit as claimed in claim 37, further comprising:

a third insulator elastic member located at a second oscillation nodal point of said piezoelectric transformer element, wherein said third insulator elastic member projects from a second side element surface of said piezoelectric transformer element.

39. The piezoelectric transformer unit as claimed in claim 8, wherein said first side element surface opposes said second side element surface and wherein said third side element surface opposes said fourth side element surface, wherein said first side elastic projection is substantially disposed at a first mid point of a first dimension of said first upper electrode, wherein said first dimension of said first upper electrode is parallel to said first side element surface, and wherein said second side elastic projection is substantially disposed at a second mid point of a second dimension of said first upper electrode, wherein said second dimension of said first upper electrode is parallel to said second side element surface.

40. The piezoelectric transformer unit as claimed in claim 8, further comprising:

a first upper elastic projection projecting from said upper surface of said piezoelectric transformer element and disposed next to an upper casing surface of said insulator; and a first lower elastic projection projecting from said lower surface of said piezoelectric transformer element and disposed next to a lower casing surface of said insulator.

41. The piezoelectric transformer unit as claimed in claim 6, wherein said first elastic projection is a first side elastic projection and is disposed next to a first side casing surface of said insulator casing and projects from said first side element surface of said piezoelectric transformer element.

42. The piezoelectric transformer unit as claimed in claim 34, further comprising:

a second upper electrode formed on said upper element surface of said piezoelectric transformer element, wherein said second insulator elastic member is substantially disposed at a mid point of a dimension of said second upper electrode, wherein said dimension of said second upper electrode is parallel to said one of said upper, lower, and first side element surfaces of said piezoelectric transformer element.

* * * * *